US007796800B2

(12) United States Patent
Picciotto et al.

(10) Patent No.: US 7,796,800 B2
(45) Date of Patent: *Sep. 14, 2010

(54) DETERMINING A DIMENSIONAL CHANGE IN A SURFACE USING IMAGES ACQUIRED BEFORE AND AFTER THE DIMENSIONAL CHANGE

(75) Inventors: Carl E. Picciotto, Menlo Park, CA (US); William M. Tong, San Francisco, CA (US); Jun Gao, Saratoga, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1316 days.

This patent is subject to a terminal disclaimer.

(21) Appl. No.: 11/046,146

(22) Filed: Jan. 28, 2005

(65) Prior Publication Data

US 2006/0170934 A1  Aug. 3, 2006

(51) Int. Cl.
*G06K 9/00* (2006.01)
(52) U.S. Cl. .................. 382/141; 382/144; 382/145; 382/147
(58) Field of Classification Search ............ 382/141, 382/152; 348/86, 125; 700/95, 212
See application file for complete search history.

(56) References Cited

U.S. PATENT DOCUMENTS

| 5,149,980 | A | | 9/1992 | Ertel et al. |
| 5,768,443 | A | * | 6/1998 | Michael et al. ............ 382/294 |
| 5,772,905 | A | | 6/1998 | Chou |
| 6,005,977 | A | * | 12/1999 | Tanimizu et al. ........... 382/216 |
| 6,064,759 | A | * | 5/2000 | Buckley et al. ............. 382/154 |
| 6,195,475 | B1 | | 2/2001 | Beausoleil, Jr. |
| 6,323,776 | B1 | * | 11/2001 | Jackson et al. ............. 340/679 |
| 6,421,458 | B2 | * | 7/2002 | Michael et al. ............ 382/151 |
| 6,476,922 | B2 | | 11/2002 | Paganelli |
| 6,696,220 | B2 | | 2/2004 | Bailey et al. |
| 6,767,127 | B2 | | 7/2004 | Paganelli |
| 6,928,628 | B2 | * | 8/2005 | Seligson et al. ................ 716/4 |
| 7,117,790 | B2 | * | 10/2006 | Kendale et al. ............ 101/327 |
| 7,194,105 | B2 | * | 3/2007 | Hersch et al. ............... 382/100 |
| 2002/0058188 | A1 | * | 5/2002 | Iwasaki et al. ................ 430/5 |
| 2002/0126732 | A1 | | 9/2002 | Shakouri et al. |
| 2004/0076322 | A1 | * | 4/2004 | Guetta ....................... 382/145 |

OTHER PUBLICATIONS

Barron, J.L. et. al., "Performance of Optical Flow Techniques," International Journal of Computer Vision 12:1, 43-77 (1994).
Jahne, B., Digital Image Processing: Concepts, Algorithms and Scientific Applications, Springer-Verlag (1997) at pp. 395-399, 404-413, and 430-437.

(Continued)

*Primary Examiner*—Samir A. Ahmed
*Assistant Examiner*—Edward Park

(57) ABSTRACT

Determining a dimensional change in a surface of an object is described. At a first time, a first image of the surface is acquired at a first spatial window thereon having a first known position relative to a frame of reference. At a second time, a second image of the surface is acquired at a second spatial window thereon having a second known position relative to the frame of reference. The first image and the second image are processed according to an image displacement sensing algorithm to determine a relative translation of a first point on the surface between the first and second times. The relative translation of the first point, the first known position, and the second known position are used to determine the dimensional change in the surface between the first and second times.

35 Claims, 6 Drawing Sheets

OTHER PUBLICATIONS

Russ, J., The Image Processing Handbook, 2nd Edition, CRC Press (1995), pp. 57-59.

Vernon, D., Fourier Vision: Segmentation and Velocity Measurement Using the Fourier Transform, Kluwer Academic Publishers (2001), pp. 16-23.

Paganelli, "Measuring the Thermal Expansion of Ultra-Thin Samples", www.ceramicindustry.com/CDA/ArticleInformation/features/BNP_Features_Item..., download Jan. 19, 2005.

James, et. al., "A Review of Measurement Techniques for the Thermal Expansion Coefficient of Metals and Alloys at Elevated Temperatures," Meas. Sci. Technol. 12 (2001) R1-R15.

Paganelli, "Using the Optical Dilatometer To Determine Sintering Behavior," American Ceramic Society Bulletin, vol. 81, No. 11, pp. 25-30 (Nov. 2002).

Raether, F., "Optical Dilatometry for the Control of Microwave Sintering Processes," www.ampereeurope.org/contrib/pub_mw-sintering_fhglsc_en.pdf, download Jan. 19, 2005.

"Thermal Expansion Measurement—Data and Techniques," Univ. Wales Swansea, http://irc.swan.ac.uk/ThExpansion.htm, download Jan. 19, 2005.

"TOMMI-A Thermooptical Measuring Device for Controlling Thermal Processes," Fraunhofer-Institut, www.isc.fraunhofer.de/english/portal/tech_8_e.html, download Jan. 19, 2005.

* cited by examiner

DETERMINING A DIMENSIONAL CHANGE IN A SURFACE USING IMAGES ACQUIRED BEFORE AND AFTER THE DIMENSIONAL CHANGE

CROSS-REFERENCE TO RELATED APPLICATIONS

The subject matter of this patent specification relates at least in part to the subject matter of U.S. Ser. No. 10/995,837, filed Nov. 23, 2004, and U.S. Ser. No. 10/995,840, also filed Nov. 23, 2004, each of which is incorporated by reference herein.

FIELD

This patent specification relates to sensing a dimensional change, such as a thermally-induced dimensional change, in a surface using an imaging system.

BACKGROUND

The fabrication of small devices often entails bringing two or more surfaces into contact with highly precise alignment criteria. By way of example, nanoimprint lithography involves bringing a mold into contact with a substrate to imprint a pattern thereon, with precision alignment becoming especially important when new patterns are to be imprinted upon a substrate having previously-imprinted patterns. Alignment issues can arise from dimensional changes in the substrate, such as those brought about by temperature changes or other intrinsic or extrinsic causes. By way of example, a substrate imprinted with a first mold at a target location might experience a thermally-induced dimension change prior to application of a second imprint mold, which may cause that target location to shift slightly. Even if the second mold is positioned exactly where the first mold was positioned in the imprinting system, there may be an undesired misalignment between the second imprinted pattern and the first imprinted pattern on the substrate.

It would be desirable to provide for precise determination of a dimensional change undergone by a surface. It would be further desirable to determine such dimensional change in a non-invasive manner. It would be still further desirable to determine such dimensional change in a manner that does not require the existence of alignment markers or similar landmarks on the surface undergoing the dimensional change.

SUMMARY

In accordance with an embodiment, a method for determining a dimensional change in a surface of an object between a first time and a second time is provided. At the first time, a first image of the surface is acquired at a first spatial window thereon having a first known position relative to a frame of reference. At the second time, a second image is acquired of the surface at a second spatial window thereon having a second known position relative to the frame of reference. The first image and the second image are processed according to an image displacement sensing algorithm to determine a relative translation of a first point on the surface between the first and second times. The dimensional change in the surface between the first and second times is determined using the relative translation of the first point, the first known position, and the second known position.

Also provided is an apparatus for determining a dimensional change in a surface of an object between a first time and a second time, comprising a first imaging device acquiring a first image of the surface at the first time in a first spatial window thereon having a first known position relative to a frame of reference. The first imaging device further acquires a second image of the surface at the second time in a second spatial window thereon having a second known position relative to the frame of reference. The apparatus further comprises a processor processing the first image and the second image to determine a relative shift of a first point on the surface between the first and second times, the determined relative shift being used in conjunction with the first known position, the second known position, and known positions of a second point on the surface at the first and second times for computing the dimensional change. Each of the first and second windows is relatively small compared to at least one dimension of the surface, and an image displacement sensing algorithm is used to determine the relative shift of the first point.

Also provided is an apparatus for imprint lithography, comprising a platen for supporting a substrate, the substrate undergoing a lateral affine distortion between a first and second time while supported by the platen. The apparatus further comprises a molding block for embossing the substrate by guiding an imprint lithography mold in a vertical direction relative to the substrate. The apparatus further comprises an imaging device configured to image the substrate at a plurality of relatively small windows thereon, each window being laterally fixed relative to at least one of the molding block and the platen. The apparatus further comprises a processor comparing, for each of the windows, a first image acquired by the imaging device at a first time to a second image acquired by the imaging device at a second time according to an image displacement sensing algorithm to compute a local shift of the substrate relative to the window. The processor subsequently determines at least one parameter associated with the affine distortion based on the computed local shifts.

DETAILED DESCRIPTION

Figure 1:
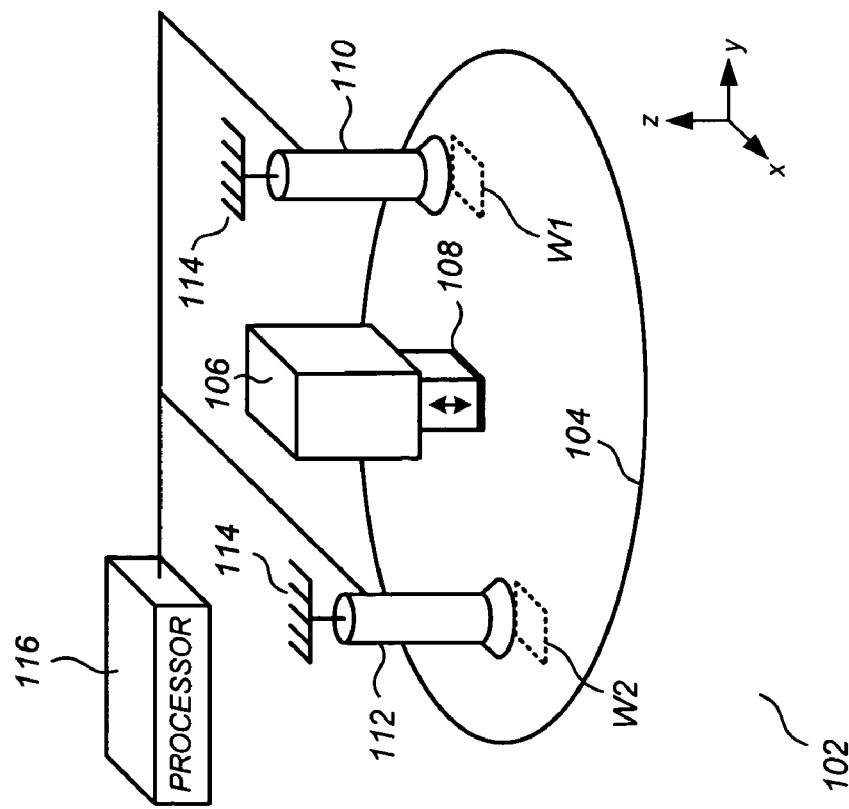
FIG. 1 illustrates an apparatus for determining a dimensional change in a surface according to an embodiment.

FIG. 1 illustrates an apparatus 102 for determining a dimensional change in a surface of a substrate according to an embodiment. Apparatus 102 comprises a first camera 110, a second camera 112, and a processor 116. In one embodiment, the apparatus 102 is a component of a larger imprint lithography apparatus that includes a molding block 106 and imprint lithography mold 108, the molding block 106 for embossing a substrate 104 by guiding the imprint lithography mold 108 in a vertical direction (i.e., the z-direction in FIG. 1) relative to the substrate 104. The mold 108 may comprise, for example, a silicon wafer having a layer of $SiO_2$ for use in a hot embossing process, or may comprise a quartz mold for use in an ultraviolet curing-based process. The substrate 104 is usually resist-coated.

However, it is to be appreciated that the scope of the present teachings is applicable in a wide variety of other scenarios. By way of example, the apparatus 102 could be used in the context of a proximity lithography system or contact lithography system, where proper alignments are likewise crucial.

Figure 3:
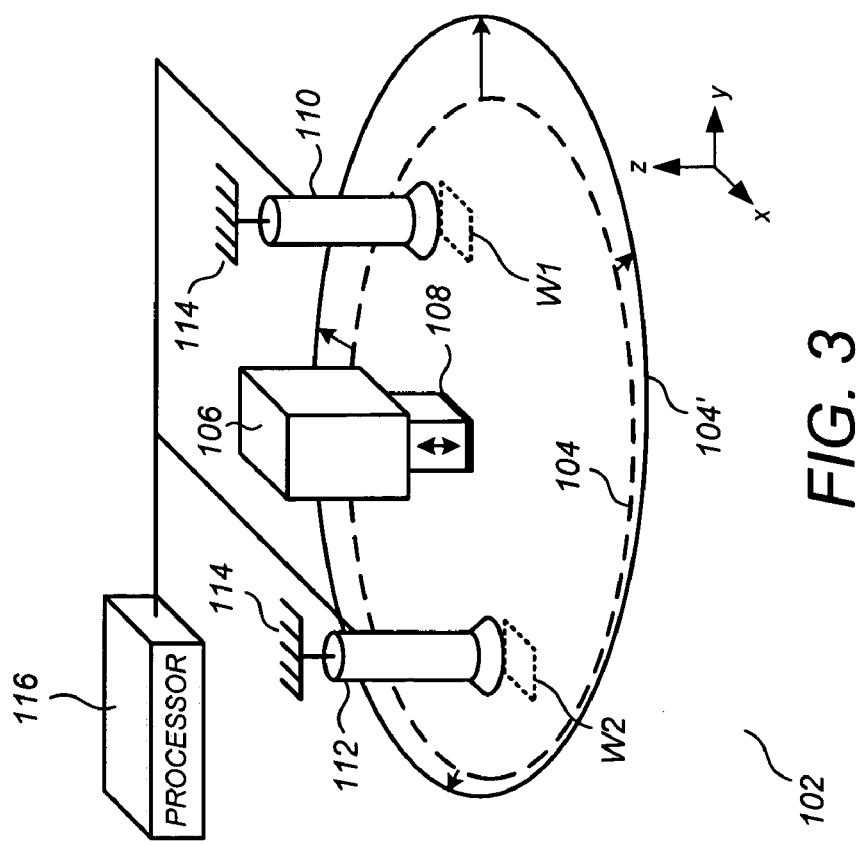
FIG. 3 illustrates the apparatus of FIG. 1 after the surface has undergone dimensional changes.

With reference to FIG. 1, the substrate 104 undergoes a lateral dimensional change (i.e., in the x-y plane of FIG. 1) that can be modeled by an affine transformation between a first time t1 and a second time t2. Referring briefly to FIG. 3, the dimensionally-changed version of the substrate 104 is denoted as the substrate 104'. By way of example and not by way of limitation, the first time t1 might be immediately after the application of a first imprint lithography mold, while the second time t2 may be just prior to application of a second imprint lithography mold. The distortion interval, i.e., the duration between the first time t1 and the second time t2, can last for sub-seconds, seconds, minutes, hours, or days without departing from the scope of the present teachings.

Mathematically, an affine transformation or affine distortion can be characterized as a linear combination of translations, stretches, shrinks, reflections, or rotations, with collinearity being preserved (i.e., straight lines map into straight lines) and concurrency being preserved (i.e., intersecting lines map into intersecting lines). For an arbitrary point $p(t1) = [x(t1), y(t1)]^T$ on a surface of the substrate 104 at time t1, that point migrates to a new position $p(t2) = [x(t2), y(t2)]^T$ on the surface of substrate 104' at time t2 according to Eqs. (1)-(3) below.

$$\begin{bmatrix} x(t2) \\ y(t2) \end{bmatrix} = M \begin{bmatrix} x(t1) \\ y(t1) \end{bmatrix} + D \quad \{1\}$$

$$M = \begin{bmatrix} a & b \\ c & d \end{bmatrix} \quad \{2\}$$

$$D = \begin{bmatrix} e \\ f \end{bmatrix} \quad \{3\}$$

For any particular affine distortion occurring between t1 and t2, the terms a, b, c, d, e, and f in Eqs. (1)-(3), are scalar parameters that characterize the affine distortion. The matrix M is referred to herein as a shaping matrix, while the vector D is referred to herein as a translation vector. Upon determination of the shaping matrix M and the translation vector D characterizing the dimensional change, the migration of any point on the surface of the substrate 104 between time t1 and t2 can be readily computed, for any of a variety of useful purposes. By way of example, knowledge of the dimensional change can be used to maintain particular points of interest at particular desirable locations using a feedback control system, as described further infra with respect to FIG. 8. By way of further example, knowledge of the dimensional change can be used to alter the target location for the next imprinting step, alter the nature of the next imprinting step such as chemical ratios and temperatures, or alter the particular mold used in the next imprinting step.

Generally speaking, the types of expansions, contractions, and shears commonly experienced by a typical substrate do not require six different parameters to be sufficiently characterized. For example, thermal expansions and contractions typically would not involve reflections or rotations. Accordingly, the dimensional change of the substrate 104 can usually be characterized with fewer than six independently-determined parameters, although the scope of the present teachings indeed extends to six-parameter scenarios. By way of example, if the substrate 104 undergoes a shearless, laterally isotropic expansion and is known to have a fixed center position relative to the frame of reference, then the shaping matrix M and the translation vector D are given by Eqs. (4)-(5) below, where s is a scalar expansion factor.

$$M = \begin{bmatrix} s & 0 \\ 0 & s \end{bmatrix} \quad \{4\}$$

$$D = \begin{bmatrix} 0 \\ 0 \end{bmatrix} \quad \{5\}$$

Accordingly, in the example of a shearless laterally isotropic expansion with fixed center position, the dimensional change can be fully characterized by the single parameter s. By way of further example, if the substrate undergoes a shearless anisotropic expansion around an unknown center point relative to the frame of reference, then the shaping matrix M and the translation vector D are given by Eqs. (6)-(7) below, where s1 and s2 are scalar directional expansion factors, and e and f are translations in the x and y directions, respectively.

$$M = \begin{bmatrix} s1 & 0 \\ 0 & s2 \end{bmatrix} \quad \{4\}$$

$$D = \begin{bmatrix} e \\ f \end{bmatrix} \quad \{5\}$$

Accordingly, in the example of a shearless laterally anisotropic expansion with unknown center position, the dimensional change can be characterized by four parameters. For more complex distortions involving shear, one or both of the additional parameters b and c of the shaping matrix M (see Eq. (2), supra) would additionally require computation for characterizing the dimensional change.

In one embodiment, the first camera 110 and second camera 112 are fixably attached to a frame of reference 114. The first camera 110 is configured to capture images of the substrate at a window W1 that is fixed relative to the frame of reference 114. The second camera 112 is configured to capture images of the substrate at a window W2 that is fixed relative to the frame of reference 114. The various point locations on the substrate are measured, and the dimensional change parameters M and D are determined, with respect to the frame of reference 114. Notably, the frame of reference 114 can itself be the molding block 106, a supporting structure of the overall machine housing the imprint lithography apparatus, a point on a nearby floor, wall, or ceiling, or generally any reference frame against which an affine distortion of the substrate 104 can be measured.

In other embodiments, the cameras 110/112 and the corresponding windows W1/W2 can themselves be movable relative to the frame of reference 114, provided that their locations are known at times t1 and t2 relative to the frame of reference. However, for clarity of explanation, the cameras 110/112 and the corresponding windows W1/W2 are presumed to be fixed in FIGS. 1 and 3 relative to the frame of reference 114. In other embodiments, the first camera 110 and the second camera 112 can be integrated into a single imaging device capable of acquiring images at windows W1 and W2. In one example, there may be a single camera mounted on a servomechanism that points the lens at W1, then at W2, then at W1, etc. In another example, there may be a single camera acquiring a large, overall image of the substrate 104, wherein images at the windows W1 and W2 would be extracted from portions of the overall image. In another example, there may be a single camera acquiring an image of some, but not all, of the substrate 104 sufficient to encompass the two windows W1 and W2, wherein images at the windows W1 and W2 would be extracted from that image.

Figure 2:
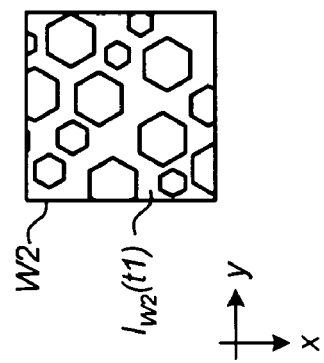
FIG. 2 illustrates images acquired by the apparatus of FIG. 1 at a first time prior to a dimensional change of the surface.
Figure 2:

FIG. 2 illustrates a first image $I_{W1}(t1)$ captured in the first window W1 at time t1, and a second image $I_{W2}(t1)$ captured in the second window W2 at time t1. Preferably, the windows W1 and W2 are relatively small compared to an overall dimension of the substrate 104. More particularly, each window should be small enough such that any dimensional changes taking place over the spatial extent of the window itself have a small or negligible effect on the operation of an image displacement sensing algorithm performed on the captured images within a required precision. Stated another way, each window should be small enough such that the small portion of the substrate being imaged safely approximates a "rigid body" for the purposes of the image displacement sensing algorithm being applied within the required precision. In one embodiment, the windows W1 and W2 have linear dimensions that are less than about one percent of the overall dimension of the substrate 104, although the scope of the present teachings is not so limited.

Notably, it is not required that alignment markers or other explicit surface markings be present on the substrate 104, provided only that there are sufficient surface textures for proper operation of an image displacement sensing algorithm. Generally speaking, using appropriate levels of magnification, typical substrates in nanoimprint lithography such as silicon wafers have sufficient native surface textures for operation of the image displacement sensing algorithms described herein, even when unprocessed. Thus, advantageously, the image displacement sensing algorithms described herein can be employed regardless of whether alignment markers are present or not.

FIG. 3 illustrates the apparatus of FIG. 1 at time t2, after the substrate 104 has undergone lateral dimensional changes and become the larger, distorted substrate 104'. According to an embodiment, at time t2 a second set of images $I_{W1}(t2)$ and $I_{W2}(t2)$ are captured in the windows W1 and W2, respectively.

Figure 4A:
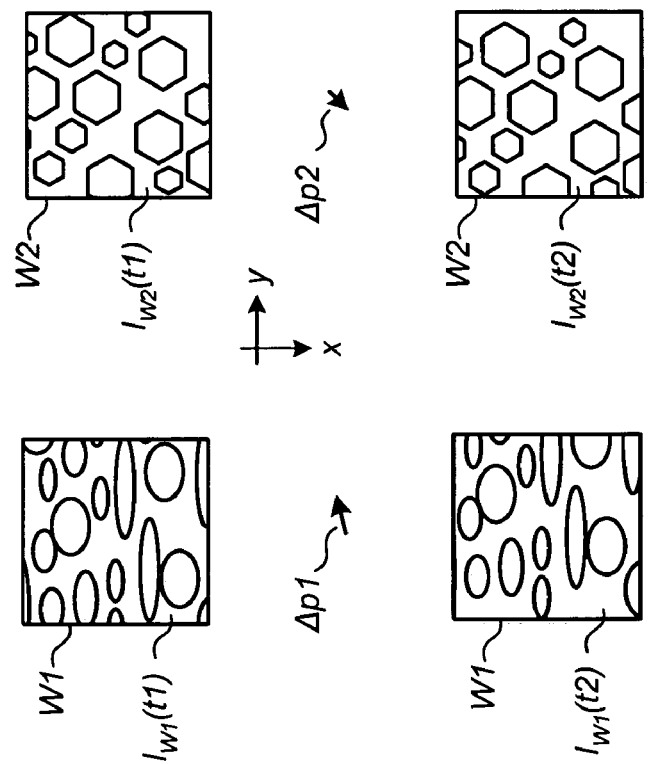
FIG. 4A illustrates the images of FIG. 2 alongside images acquired at a second time subsequent to the dimensional changes, and shift arrows associated therewith.

FIG. 4A illustrates the acquired images $I_{W1}(t2)$ and $I_{W2}(t2)$ alongside the previously acquired images $I_{W1}(t1)$ and $I_{W2}(t1)$. According to an embodiment, for each of the windows W1 and W2, a local shift in the substrate between times t1 and t2 relative to that window is computed according to an image displacement sensing algorithm.

Image displacement sensing algorithm refers to a class of processing algorithms in which a first matrix $L_t(x,y)$ and a second matrix $L_{t+\Delta t}(x,y)$ are processed to compute a displacement vector $\Delta L$ therebetween under a rigid body assumption, i.e., under an assumption that features or textures of the underlying item do not change over the interval $\Delta t$. In one embodiment, image displacement sensing algorithm refers to a subclass of image flow algorithms specially adapted for fast computation under the rigid body assumption. In another embodiment, image displacement sensing algorithm refers to a subclass of image flow algorithms specially adapted for detection of rigid-body displacements to sub-pixel resolutions. In still another embodiment, image displacement sensing algorithm refers to a subclass of image flow algorithms specially adapted to achieve both fast computation and sub-pixel resolution under the rigid body assumption.

In accordance with an embodiment, it has been found that one particularly useful image displacement algorithm cross-correlates the first and second matrices to produce a cross-correlation function, and then locates a global extremum of the cross-correlation function. Preferably, the cross-correlating further comprises estimating a continuous correlation surface at sub-pixel locations. A comparison function is computed comprising, for a predetermined number N of relative offset locations (N=9, 25, for example), a sum of squared differences, or other comparison metric, between the elements of the first and second matrices. A cost function is minimized between the comparison function and an estimated continuous correlation surface, wherein the estimated continuous correlation surface is a fitting function whose parameters are varied to minimize the cost function. In one embodiment, the fitting function is equivalent to a truncated Taylor series, although the scope of the present teachings is not so limited. In one embodiment in which the number of offset locations N is 9, the fitting function has six parameters, although the scope of the present teachings is not so limited. A global extremum of the estimated continuous correlation surface is located to determine the displacement, whereby the displacement can be determined to a sub-pixel resolution. Discussions of comparable methods used for optically-acquired images can be found in U.S. Pat. No. 5,149,180 and U.S. Pat. No. 6,195,475. In accordance with another embodiment, it has been found that another particularly useful image displacement algorithm computes phase differences between frequency domain representations of the first and second matrices, and determines image displacement based on the computed phase differences.

In other embodiments, image displacement sensing algorithms can be used comprising at least one of a differential image flow algorithm, a tensor-based image flow algorithm, a correlation-based image flow algorithm, a phase-shift-based image flow algorithm, and an error analysis-based algorithm, each adapted for rigid-body flow. The outputs of the image displacement sensing algorithms for windows W1 and W2 are the shift vectors $\Delta p1$ and $\Delta p2$ that, as illustrated in FIG. 4A, indicate how far the surface has shifted beneath each respective window between times t1 and t2.

Figure 4B:
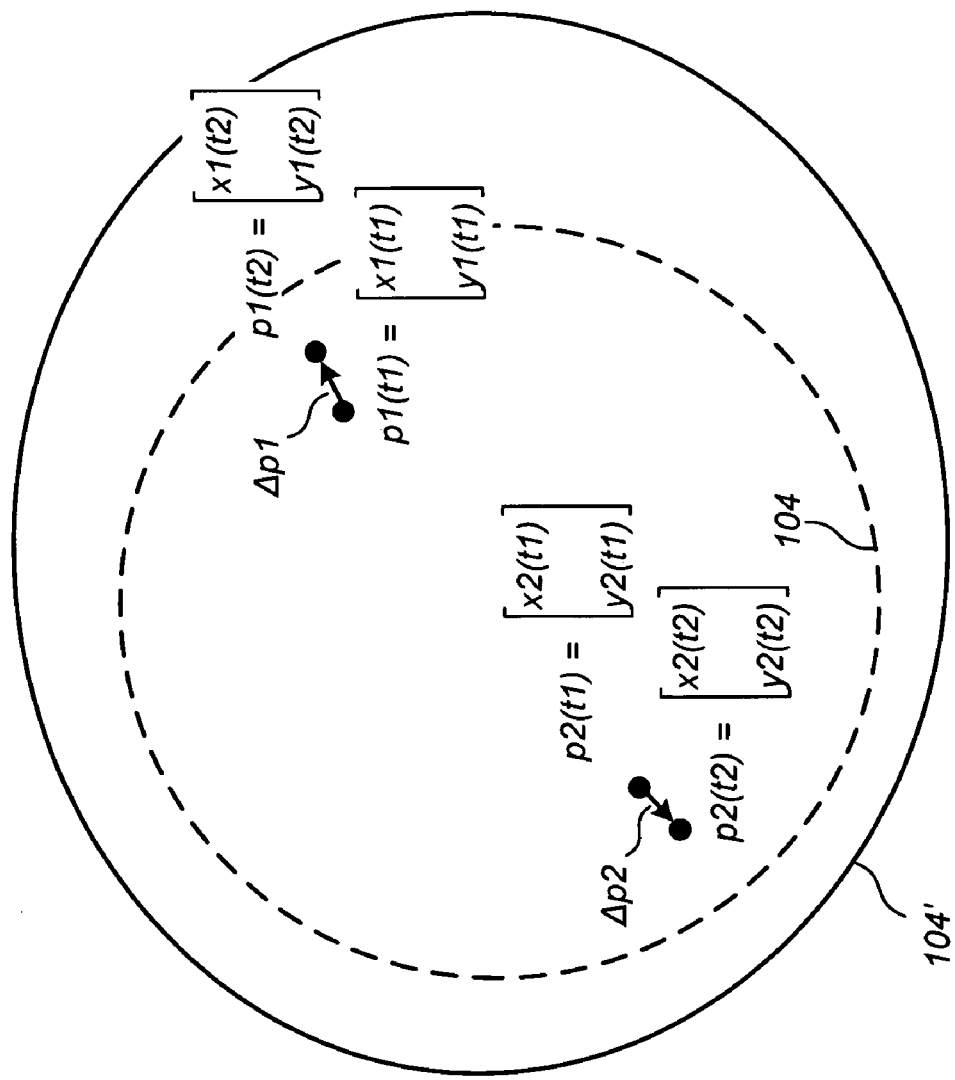
FIG. 4B illustrates an exaggerated conceptual view of a substrate before and after undergoing a dimensional change, and two shifted points thereon.

FIG. 4B illustrates an exaggerated conceptual view of the substrate 104-104' before and after undergoing a dimensional change, particularly showing two substrate points p1(t1) and p2(t1) beneath the windows W1 and W2, respectively, as shifted by $\Delta p1$ and $\Delta p2$ to the new locations p1(t2) and p2(t2). The absolute coordinates of p1(t1), p2(t1), p1(t2), and p2(t2) are determined based upon the known positions of W1 and W2 at times t1 and t2, together with the values of $\Delta p1$ and $\Delta p2$. To determine the dimensional change, the values of p1(t1), p2(t1), p1(t2), and p2(t2) are substituted into Eq. (1), supra, yielding Eqs. (6)-(7) which can then be solved for the shaping matrix M and the translation vector D.

$$\begin{bmatrix} x1(t2) \\ y1(t2) \end{bmatrix} = M \begin{bmatrix} x1(t1) \\ y1(t1) \end{bmatrix} + D \qquad (6)$$

$$\begin{bmatrix} x2(t2) \\ y2(t2) \end{bmatrix} = M \begin{bmatrix} x2(t1) \\ y2(t1) \end{bmatrix} + D \qquad (7)$$

In the event that the windows W1 and/or W2 are moved between times t1 and t2 by known amounts, the coordinates in Eqs. (6)-(7) can be offset as needed prior to computation of the shaping matrix M and the translation vector D. As would be readily understood upon review of the above equations, four distortion parameters could be readily computed using the measurements for two image windows at times t1 and t2. By way of example, the parameters s1, s2, e, and f (see Eqs. (4)-(5), supra) for an anisotropic expansion having an unknown center could be readily computed. Overconstraint conditions, such as might be encountered where an expansion/contraction is known to be isotropic, can be advantageously used to achieve results of even higher reliability by using interpolation methods between alternative result sets, any of a variety of known statistical fitting methods, or any of a variety of analogous known mathematical techniques.

Figure 5:
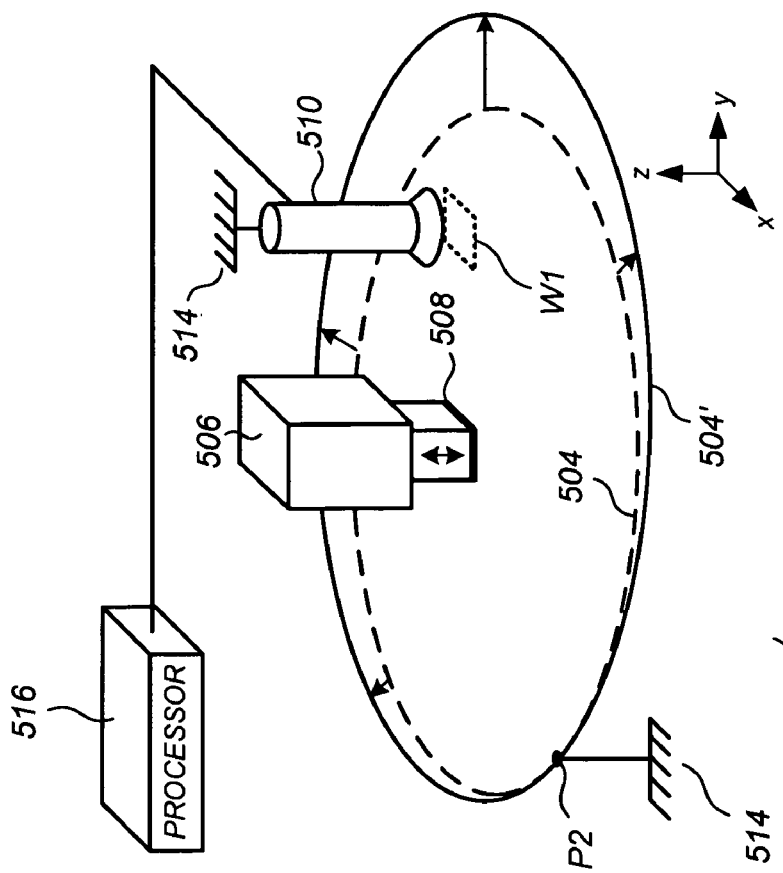
FIG. 5 illustrates an apparatus for determining a dimensional change in a surface according to an embodiment.

FIG. 5 illustrates an apparatus 502 for determining a dimensional change in a surface of a substrate according to an embodiment. Apparatus 502 comprises a single camera 510 and a processor 516. The single camera 510 is fixed relative to a frame of reference 514, although it may be movable by known amounts without departing from the scope of the present teachings. In one embodiment, the apparatus 502 is a component of a larger imprint lithography apparatus that includes a molding block 506 and imprint lithography mold 508. In the embodiment of FIG. 5, it is presumed that a particular point P2 is fixed relative to the frame of reference 514 at both times t1 and t2. By way of example, the substrate 504 may be known to expand or contract around the point P2, or the point P2 may be physically clamped. In other embodiments, the point P2 may move between times t1 and t2, provided that the movements are known or otherwise measurable. Operation of the device of FIG. 5 proceeds in a manner similar to that of FIGS. 1 and 3, except that only one camera is used and images are only captured in a single window W1. The parameters of the affine distortion can then be computed according to Eqs. (6)-(7), supra, with the known values for the point P2 being used in Eq. (7).

Figure 6:
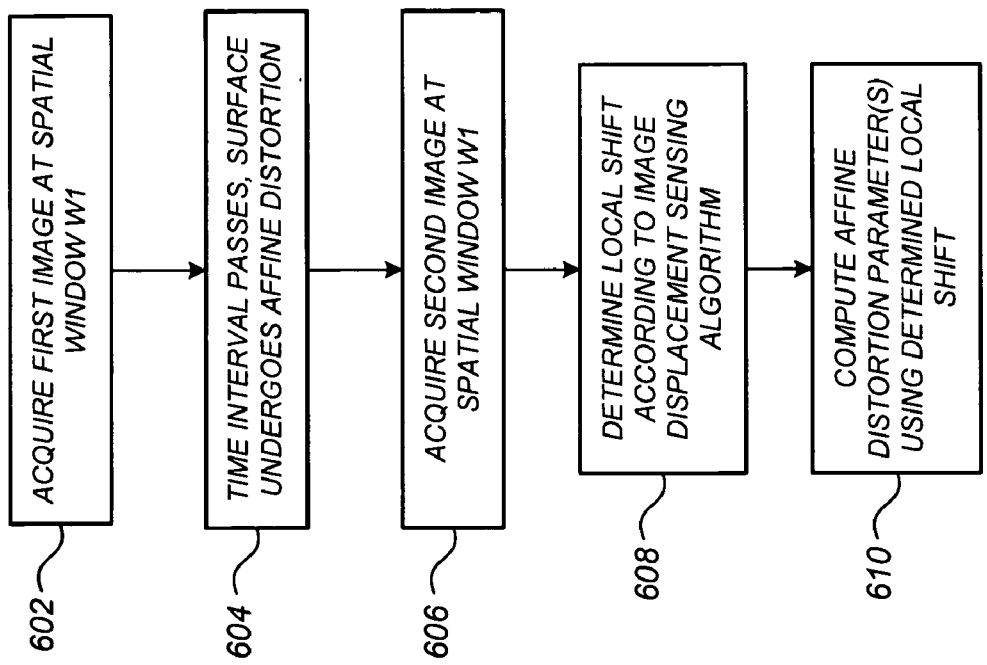
FIG. 6 illustrates determining a dimensional change in a surface according to an embodiment.

FIG. 6 illustrates determining a dimensional change in a surface according to an embodiment, with particular reference to the single-camera case of FIG. 5. At step 602, a first image $I_{W1}(t1)$ is acquired at a spatial window W1 at time t1. At step 604, a time interval passes between t1 and t2 and the surface undergoes an affine distortion. At step 606, a second image $I_{W1}(t2)$ is acquired at the spatial window W1. Optionally, the spatial window W1 may have itself shifted to become a different spatial window W1' at time t2 as previously described, provided that its locations at times t1 and t2 are known. At step 608, the first and second images $I_{W1}(t1)$ and $I_{W1}(t2)$ are processed according to an image displacement sensing algorithm to determine a local shift $\Delta p1$ of a point p1 on the substrate beneath the window W1. At step 610, parameters associated with the affine distortion are computed based upon the known position of window W1 at times t1 and t2, together with the local shift $\Delta p1$. It is to be appreciated that particular computation of all elements of the shaping matrix M and the translation vector D is not always necessary for achieving the physical goal presented. More generally, determination of the dimensional change according to the present teachings may involve computation of only a subset of those matrix elements, or may involve computation of other useful parameters that, although ultimately related to the matrix elements in at least one way, are not themselves the specific parameters a-f of Eqs. (1)-(3). For example, using the acquired images and the sensed local displacements, the dimensional change may be computed and/or expressed in terms of percentages, centroid shifts, edge shifts, one or more local shifts of substrate points other than those beneath W1 (e.g., points of interest such as imprint locations), and the like.

Figure 7:
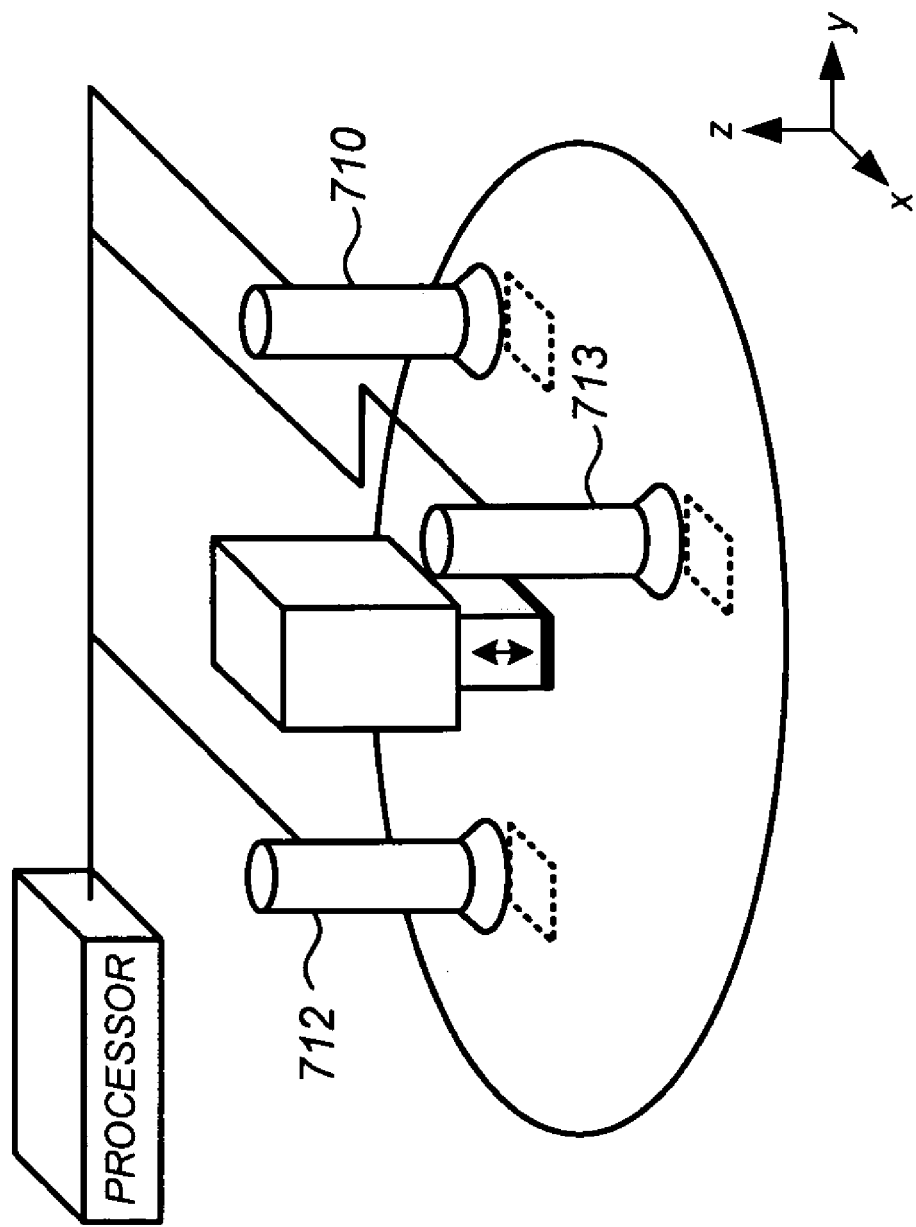
FIG. 7 illustrates an apparatus for determining a dimensional change in a surface according to an embodiment.

FIG. 7 illustrates an apparatus for determining a dimensional change in a surface of a substrate according to an embodiment, the apparatus being similar to that of FIGS. 1 and 3 except that three (3) cameras 710, 712, and 713 are used. In other embodiments, four or more cameras may be used, with any overconstraint conditions being advantageously employed to further increase the precision and/or reliability of the results.

Sensing a dimensional change in a surface according to the present teachings brings about several advantages. For example, a high degree of precision can be achieved, as facilitated by the sub-pixel resolution capabilities of one or more of the image displacement sensing algorithms described supra. Moreover, there is no dependence on the availability of alignment markers or other similar surface markings, although they would be inherently accommodated if present. The dimensional change detections are non-invasive, not requiring physical contact with any particular portion of the distorting substrate. Furthermore, system integration is promoted because the same camera used for dimensional change sensing can optionally be used for other alignment sensing and control purposes as described, for example, in Ser. Nos. 10/995,837 and 10/995,840, supra.

Figure 8:
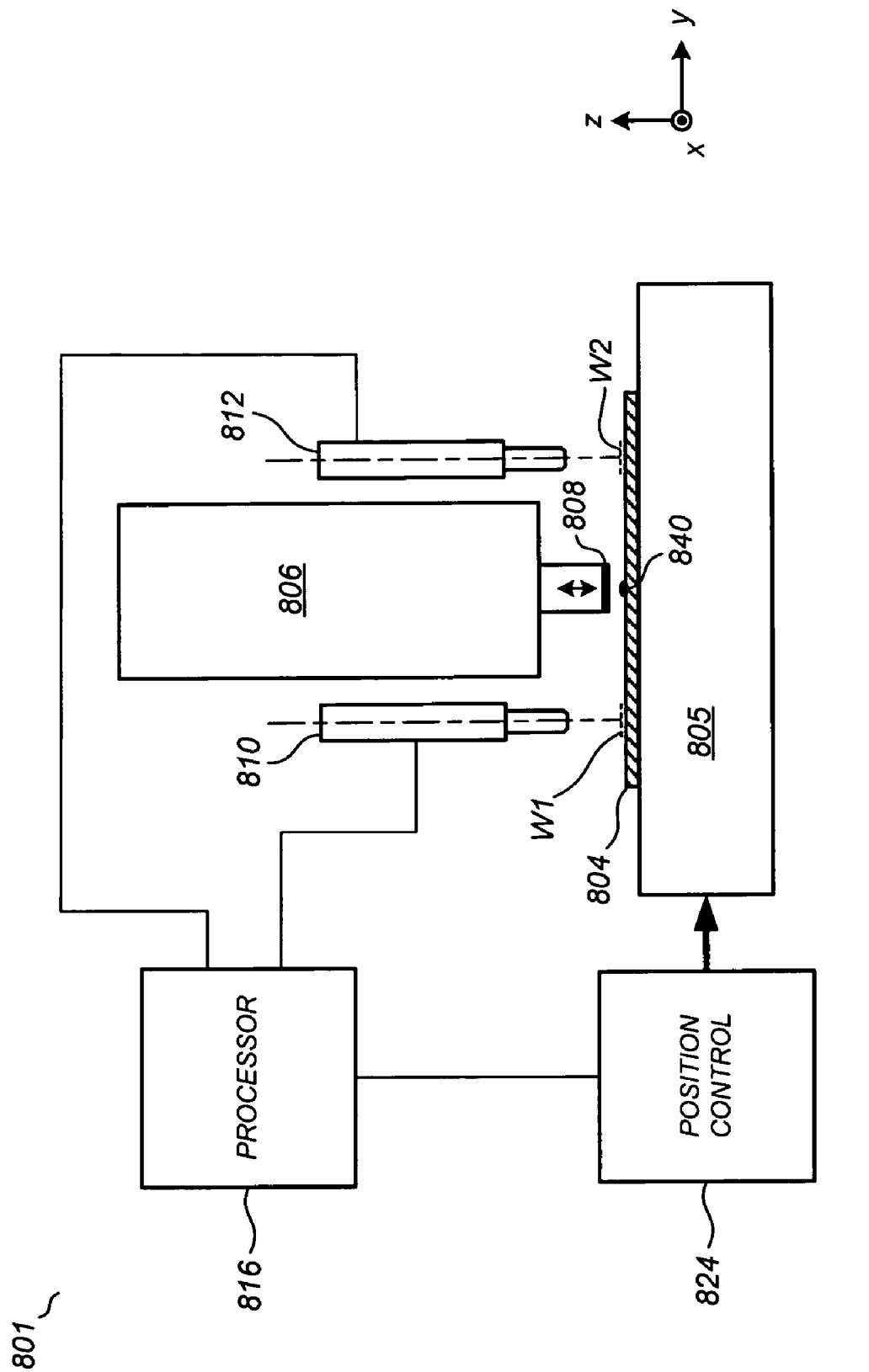
FIG. 8 illustrates an imprint lithography apparatus according to an embodiment.

FIG. 8 illustrates an imprint lithography apparatus 801 according to an embodiment comprising a platen 805, a molding block 806, a first camera 810, a second camera 812, a processor 816, and a position control system 824. Platen 805 is for supporting a substrate 804. The platen may hold the substrate 804 in place using, for example, suction means (not shown) from the underside. Molding block 806 embosses the substrate 804 by guiding an imprint lithography mold 808 in a vertical direction relative to the substrate 804.

The substrate 804 undergoes an affine distortion during an interval between a first time and a second time. The first camera 810 is positioned to acquire images in a first window W1, the window W1 being fixably positioned relative to a frame of reference. Generally speaking, the frame of reference can be the molding block 806, the platen 805, a frame (not shown) housing the apparatus 801, or generally any reference frame against which an affine distortion of the substrate 804 can be measured. As with other embodiments supra, the first window W1 is presumed to be fixed throughout the process for simplicity and clarity of description, it being understood that in other embodiments the window W1 could move by predetermined, known, and/or measurable amounts without departing from the scope of the present teachings. The second camera 812 is likewise positioned to acquire images in a second window W2. As with other embodiments supra, the first camera 810 and the second camera 812 can be integrated into a single imaging device capable of acquiring images at windows W1 and W2. In one example, there may be a single camera mounted on a servomechanism that points the lens at W1, then at W2, then at W1, etc. In another example, there may be a single camera acquiring a large, overall image of the substrate 804, wherein images at the windows W1 and W2 would be extracted from portions of the overall image. In another example, there may be a single camera acquiring an image of some, but not all, of the substrate 104 sufficient to encompass the two windows W1 and W2, wherein images at the windows W1 and W2 would be extracted from that image.

Using first and second cameras 810 and 812, images $I_{W1}(t1)$, $I_{W2}(t1)$, $I_{W1}(t2)$, and $I_{W2}(t2)$ are acquired at times t1 and t2, respectively. An image displacement sensing algorithm is then used by processor 816 to determine first and second local offsets $\Delta p1$ and $\Delta p2$ of two points on the surface of substrate 804. The first and second local offsets $\Delta p1$ and $\Delta p2$ represent parameters associated with the affine distortion of the substrate 804, insofar as the shaping matrix M and translation vector D characterizing the affine distortion can be computed from $\Delta p1$ and $\Delta p2$ and the known positions of W1 and W2.

In one embodiment, the windows W1 and W2 are symmetric around a central point of interest 840 lying directly underneath the molding block 806, that is, the central point of interest 840 is centered between the windows W1 and W2. Usually, the central point of interest 840 will be a target imprinting location in a multi-iteration imprint process, although the scope of the present teachings is not so limited. In this embodiment, the processor 816 operates in conjunction with the position control system 824 to maintain the first and second local offsets $\Delta p1$ and $\Delta p2$ at equal and opposite values. In this manner, the central point of interest 840 remains directly at the target location despite the distortions being experienced by the substrate 804. In other embodiments, three or more windows may be imaged and the results used to maintain a position of a central point of interest. The position control system 824 may alternatively move the molding block 806 to cause the central point of interest 840 to remain thereunder, or may move both the molding block 806 and the platen 805 to achieve that goal.

Whereas many alterations and modifications of the embodiments will no doubt become apparent to a person of ordinary skill in the art after having read the foregoing description, it is to be understood that the particular embodiments shown and described by way of illustration are in no way intended to be considered limiting. By way of example, although one or more embodiments supra are described in the context of a nanoimprint lithography environment, the scope of the present teachings is not so limited. Thus, for example, the present teachings may be advantageously applied in any of a variety of environments in which non-invasive, high-precision determination of affine deformations in a surface is desired, especially where the surface may not have distinct alignment markers but otherwise has viewable surface textures.

By way of further example, although at least one embodiment supra presumes that the entire substrate undergoes a common affine distortion characterized by a single shaping matrix M and translation vector D, the present teachings are readily applied in the context of an overall substrate undergoing a variety of different kinds of stresses and deformations. In particular, the present teachings are readily applied where a small portion of that substrate can be modeled or presumed to undergo an affine distortion characterized by a shaping matrix M and translation vector D, even if a larger overall substrate area has more complex or inconsistent deformation patterns. This may be particularly useful, for example, if the presence of a molding block elevates the temperature of a central region of a larger substrate, but does not elevate the temperature of the surrounding regions of the larger substrate. Even further, the present teachings are further applicable for the more general scenario of nonlinear distortions that can be characterized by one or more parameters based on one or more locally-sensed substrate shifts.

By way of still further example, although placing the cameras perpendicular to the substrate is desirable in terms of computational ease for the image displacement sensing algorithms, the scope of the present teachings is not so limited. In other embodiments, one or more cameras may be tilted relative to the substrate, as may be needed in view of apparatus space considerations, for example, with appropriate known tilting and perspective compensation procedures being used in conjunction with the image displacement sensing algorithms. Thus, reference to the details of the described embodiments are not intended to limit their scope.

What is claimed is:

1. A method for determining a dimensional change in a surface of an object, comprising:

at a first time, acquiring a first image of said surface at a first spatial window thereon having a first known position relative to a frame of reference with a first imaging device;

at a second time, acquiring a second image of said surface at a second spatial window thereon having a second known position relative to said frame of reference with the first imaging device, the surface having undergone the dimensional change between the first time and the second time;

processing said first image and said second image according to an image displacement sensing algorithm to determine a relative translation of a first point on said surface between said first and second times with a processor; and using said relative translation of said first point, said first known position, and said second known position to determine the dimensional change in said surface between said first and second times with the processor.

2. The method of claim 1, wherein said first and second spatial windows are relatively small compared to an overall dimension of said surface such that the dimensional change in the first and the second spatial windows has a small or negligible effect on the image displacement sensing algorithm.

3. The method of claim 2, said first image being acquired by the first imaging device, said second image also being acquired by the first imaging device.

4. The method of claim 3, wherein said first and second spatial windows are at a same location.

5. The method of claim 2, wherein the dimensional change of said surface comprises an isotropic expansion, and wherein said surface includes a reference point having a known location relative to said frame of reference at each of said first and second times.

6. The method of claim 2, the dimensional change of said surface comprising an affine distortion, the method further comprising:

near said first time, acquiring a third image of said surface at a third spatial window thereon having a third known position relative to said frame of reference with a second imaging device;

near said second time, acquiring a fourth image of said surface at a fourth spatial window thereon having a fourth known position relative to said frame of reference with the second imaging device;

processing said third image and said fourth image to determine a relative translation of a second point on said surface between said first and second times with the processor; and using said relative translation of said second point, said third known position, and said fourth known position in conjunction with said relative translation of said first point, said first known position, and said second known position to determine the dimensional change in said surface between said first and second times with the processor.

7. The method of claim 6, said first and second images being acquired by the first imaging device such that said first and second spatial windows are at a first common location fixed relative to the frame of reference, said third and fourth images being acquired by the second imaging device such that said third and fourth spatial windows are at a second common location fixed relative to the frame of reference, said surface including a central point of interest, the method further comprising:

prior to said first time, causing said central point of interest to be centered between said first and second common locations; and providing said determined relative translations of said first and second points to a feedback control system mechanically coupled to said object and configured to maintain said relative translations of said first and second points at equal and opposite values, thereby causing said central point of interest to remain centered between said first and second common locations.

8. The method of claim 6, further comprising:

near said first time, acquiring a fifth image of said surface at a fifth spatial window thereon having a fifth known position relative to said frame of reference with a third imaging device;

near said second time, acquiring a sixth image of said surface at a sixth spatial window thereon having a sixth known position relative to said frame of reference with the third imaging device;

processing said fifth image and said sixth image to determine a relative translation of a third point on said surface between said first and second times with the processor; and using said relative translations of said first, second, and third points in conjunction with said first, second, third, fourth, fifth, and sixth positions to determine the dimensional change in said surface between said first and second times with the processor.

9. The method of claim 1, wherein said processing said first image and said second image according to an image displacement sensing algorithm comprises:

cross-correlating said first image and said second image to produce a cross-correlation function with the processor; and locating a global extremum of said cross-correlation function with the processor.

10. The method of claim 9, said first image and said second image comprising pixels, wherein said cross-correlating comprises estimating a continuous correlation surface at subpixel locations, said estimating comprising:

computing a comparison function comprising, for each of a predetermined number of relative offset locations between the first image and the second image, a comparison metric therebetween with the processor; and minimizing a cost function between the comparison function and an estimated continuous correlation surface, wherein the estimated continuous correlation surface comprises a finite-element fitting function with the processor.

11. The method of claim 10, wherein said comparison metric comprises a pixelwise sum of squared differences between said first image and said second image at each offset, and wherein said predetermined number of relative offsets is a relatively small percentage of a total number of elements in said first image.

12. The method of claim 1, wherein said processing said first image and said second image according to an image displacement sensing algorithm comprises determining a phase difference between frequency domain representations of said first and second images.

13. The method of claim 1, wherein said object comprises a nanoimprint lithography substrate, and wherein said frame of reference is fixably associated with an imprint lithography apparatus supporting said nanoimprint lithography substrate.

14. An apparatus for determining a dimensional change in a surface of an object between a first time and a second time, comprising:

a first imaging device acquiring a first image of the surface at the first time in a first spatial window thereon having a first known position relative to a frame of reference and acquiring a second image of the surface at the second time in a second spatial window thereon having a second known position relative to the frame of reference, the surface having undergone the dimensional change between the first time and the second time; and a processor processing said first image and said second image to determine a relative shift of a first point on said surface between said first and second times, said determined relative shift being used in conjunction with said first known position, said second known position, and known positions of a second point on said surface at said first and second times for computing the dimensional change;

wherein each of said first and second windows is relatively small compared to at least one dimension of the surface;

and wherein said processing said first image and said second image to determine said relative shift comprises an image displacement sensing algorithm.

15. The apparatus of claim 14, wherein said image displacement sensing algorithm comprises at least one of a differential image flow algorithm, a tensor-based image flow algorithm, a correlation-based image flow algorithm, a phase-shift-based image flow algorithm, and an error analysis-based algorithm, each adapted for rigid-body flow.

16. The apparatus of claim 15, wherein said object comprises a nanoimprint lithography substrate, wherein said first imaging device comprises an optical camera, and wherein said frame of reference is fixably associated with an imprint lithography apparatus supporting said nanoimprint lithography substrate.

17. The apparatus of claim 16, wherein said second point is fixably positioned relative to said imprint lithography apparatus at said first and second times.

18. The apparatus of claim 14, the dimensional change of said surface comprising an affine distortion, the apparatus further comprising a second imaging device acquiring a third image of the surface near the first time in a third spatial window thereon having a third known position relative to the frame of reference, said third image including said second point, said second imaging device acquiring a fourth image of the surface near the second time in a fourth spatial window thereon having a fourth known position relative to the frame of reference, said processor computing said known positions of said second point using said third image, said fourth image, and said third and fourth known locations.

19. The apparatus of claim 18, said first and second spatial windows being at a first common location fixed relative to the frame of reference, said third and fourth spatial windows being at a second common location fixed relative to the frame of reference, said surface including a central point of interest positioned halfway between said first and second common locations, the apparatus further comprising a feedback control system mechanically coupled to said object and configured to use said computed dimensional change to maintain said central point of interest halfway between said first and second common locations.

20. The apparatus of claim 18, further comprising a third imaging device acquiring a fifth image of the surface near the first time in a fifth spatial window thereon having a fifth known position relative to the frame of reference, said third imaging device acquiring a sixth image of the surface near the second time in a sixth spatial window thereon having a sixth known position relative to the frame of reference, said processor processing said fifth image and said sixth image to determine a relative shift of a third point on said surface between said first and second times, said processor computing the dimensional change based on the relative shift of the first point, the relative shift of the third point, the known positions of said second point at said first and second times, and said first, second, fifth, and sixth known positions.

21. An apparatus for determining a dimensional change in a substrate, comprising:
   means for acquiring a first image of the substrate at a first time in a first spatial window thereover having a first known position relative to a frame of reference;
   means for acquiring a second image of the substrate at a second time in a second spatial window thereover having a second known position relative to the frame of reference, the substrate having undergone the dimensional change between the first time and the second time; and
   means for processing said first image and said second image to determine a relative shift of a first point on said substrate between said first and second times, said determined relative shift being used in conjunction with said first known position, said second known position, and known positions of a second point on said substrate at said first and second times for computing the dimensional change;
   wherein each of said first and second windows is relatively small compared to at least one dimension of the surface;
   and wherein said means for processing said first image and said second image to determine said relative shift uses an image displacement sensing algorithm.

22. The apparatus of claim 21, wherein said image displacement sensing algorithm comprises at least one of a differential image flow algorithm, a tensor-based image flow algorithm, a correlation-based image flow algorithm, a phase-shift-based image flow algorithm, and an error analysis-based algorithm, each adapted for rigid-body flow.

23. The apparatus of claim 22, said means for imaging comprises an optical camera, and wherein said frame of reference is fixably associated with an imprint lithography apparatus supporting said substrate.

24. A non-transitory computer readable medium storing computer code for determining a dimensional change in a surface of an object, comprising:
   computer code for receiving a first image of the surface in a first spatial window thereon having a first known position relative to a frame of reference, the first image being acquired at a first time;
   computer code for receiving a second image of the surface in a second spatial window thereon having a second known position relative to said frame of reference, the second image being acquired at a second time, the surface having undergone the dimensional change between the first time and the second time;
   computer code for processing said first image and said second image according to an image displacement sensing algorithm to determine a relative translation of a first point on said surface between said first and second times; and
   computer code for determining the dimensional change in said surface between said first and second times based on said relative translation of said first point, said first known position, and said second known position.

25. The non-transitory computer readable medium of claim 24, wherein said first and second spatial windows are relatively small compared to an overall dimension of said surface.

26. The non-transitory computer readable medium of claim 25, said first image and said second image having been acquired by the same camera.

27. The non-transitory computer readable medium of claim 25, wherein the dimensional change of said surface comprises an isotropic expansion, and wherein said surface includes a reference point having a known location relative to said flame of reference at each of said first and second times.

28. The non-transitory computer readable medium of claim 25, the dimensional change of said surface comprising an affine distortion, further comprising:
   computer code for receiving a third image of said surface at a third spatial window thereon having a third known position relative to said frame of reference, the third image being acquired near said first time;
   computer code for receiving a fourth image of said surface at a fourth spatial window thereon having a fourth known position relative to said frame of reference, the fourth image being acquired near said second time;
   computer code for processing said third image and said fourth image to determine a relative translation of a second point on said surface between said first and second times; and
   computer code for determining the dimensional change in said surface between said first and second times using said relative translation of said second point, said third known position, and said fourth known position in conjunction with said relative translation of said first point, said first known position, and said second known position.

29. An apparatus for imprint lithography, comprising:
   a platen for supporting a substrate, said substrate undergoing a lateral affine distortion between a first and second time while supported by said platen;
   a molding block for embossing said substrate by guiding an imprint lithography mold in a vertical direction relative to said substrate;
   an imaging device configured to image said substrate at a plurality of relatively small windows thereon, each window being laterally fixed relative to at least one of said molding block and said platen; and
   a processor comparing, for each of said windows, a first image acquired by said imaging device at a first time to a second image acquired by said imaging device at a second time according to an image displacement sensing algorithm to compute a local shift of said substrate relative to said window, said processor subsequently determining at least one parameter associated with said affine distortion based on said computed local shifts, the substrate having undergone the dimensional change between the first time and the second time.

30. The apparatus of claim 29, wherein said comparing said first image to said second image according to an image displacement sensing algorithm comprises:
   cross-correlating said first image and said second image to produce a cross-correlation function; and
   locating a global extremum of said cross-correlation function.

31. The apparatus of claim 30, said first image and said second image comprising pixels, wherein said cross-correlating comprises estimating a continuous correlation surface at sub-pixel locations, said estimating comprising:
   computing a comparison function comprising, for each of a predetermined number of relative offset locations between the first image and the second image, a comparison metric therebetween; and minimizing a cost function between the comparison function and an estimated continuous correlation surface, wherein the estimated continuous correlation surface comprises a finite-element fitting function.

32. The apparatus of claim 31, wherein said comparison metric comprises a pixelwise sum of squared differences between said first image and said second image at each offset, and wherein said predetermined number of relative offsets is a relatively small percentage of a total number of elements in said first image.

33. The apparatus of claim 29, wherein said comparing said first image to said second image according to an image displacement sensing algorithm comprises determining a phase difference between frequency domain representations of said first and second images.

34. The apparatus of claim 29, wherein said affine distortion is associated with an isotropic lateral expansion parameter, a first translation parameter for a first lateral direction, and a second translation parameter for a second lateral direction, and wherein said imaging device comprises two optical cameras imaging said substrate at two windows laterally fixed relative to said molding block.

35. The apparatus of claim 29, further comprising a feedback control system coupled to said processor and mechanically coupled to one of said platen and said molding block, said feedback control system maintaining a predetermined local area on said substrate in a fixed position relative to said molding block based upon said at least one determined affine distortion parameter.

* * * * *

UNITED STATES PATENT AND TRADEMARK OFFICE
CERTIFICATE OF CORRECTION

PATENT NO. : 7,796,800 B2
APPLICATION NO. : 11/046146
DATED : September 14, 2010
INVENTOR(S) : Picciotto et al.

Page 1 of 1

It is certified that error appears in the above-identified patent and that said Letters Patent is hereby corrected as shown below:

In column 14, line 7, in Claim 27, delete "flame" and insert --frame--, therefor.

Signed and Sealed this
Fourteenth Day of June, 2011

David J. Kappos
*Director of the United States Patent and Trademark Office*